11/1/83 XR 4,413,198

United States Patent [19]

Bost

[11] 4,413,198

[45] Nov. 1, 1983

[54] PIEZOELECTRIC TRANSDUCER APPARATUS

[75] Inventor: Jonathan R. Bost, Albuquerque, N. Mex.

[73] Assignee: Motorola, Inc., Schaumburg, Ill.

[21] Appl. No.: 335,933

[22] Filed: Dec. 30, 1981

[51] Int. Cl.[3] .......... H01L 41/08

[52] U.S. Cl. .......... 310/324; 310/322; 179/110 A

[58] Field of Search .......... 310/322, 324, 323; 179/110 A, 180, 182 R, 121; 340/384 E; 181/160, 182

[56] References Cited

U.S. PATENT DOCUMENTS

| | | | |
|---|---|---|---|
| 3,748,502 | 7/1973 | Bernstein | 310/8 |
| 3,856,995 | 12/1974 | Cragg et al. | 179/121 R |
| 3,873,866 | 3/1975 | Goble | 310/9.1 |
| 3,921,016 | 11/1975 | Livermore | 310/322 |
| 3,970,879 | 7/1976 | Kumon | 310/322 |
| 3,978,353 | 8/1976 | Kinoshita | 310/8.1 |
| 3,982,142 | 9/1976 | Goble | 310/8.2 |
| 4,042,845 | 8/1981 | Hackett | 310/322 |
| 4,079,213 | 3/1981 | Bage et al. | 179/110 A |
| 4,156,800 | 5/1979 | Sear | 310/332 |
| 4,292,561 | 9/1981 | Martin | 310/322 |

FOREIGN PATENT DOCUMENTS

| | | | |
|---|---|---|---|
| 25955 | 4/1981 | European Pat. Off. | 179/110 A |

*Primary Examiner*—Mark O. Budd
*Attorney, Agent, or Firm*—Mark P. Kahler; Edward M. Roney; James W. Gillman

[57] ABSTRACT

An electroacoustic loudspeaker apparatus is provided including a piezoelectric driver element, the opposed major surfaces of which are acoustically coupled into first and second resonant structures. The first resonant structure exhibits a resonant frequency less than the resonant frequency of the driver and the second resonant structure exhibits a resonant frequency greater than the resonant frequency of the driver thus resulting in a broadened or enhanced frequency response.

4 Claims, 2 Drawing Figures

PIEZOELECTRIC TRANSDUCER APPARATUS

BACKGROUND OF THE INVENTION

This invention relates to piezoelectric electroacoustic transducers, and more particularly, to an improved piezoelectric acoustic transducer apparatus which exhibits an enhanced or broadened frequency response.

DESCRIPTION OF THE PRIOR ART

Recently, piezoelectric transducers such as monomorphs have been increasingly used in signalling devices such as pagers and other alerting apparatus which employ an essentially single tone alert signal. A monomorph includes a ceramic disk bonded to a metallic backplate thus forming a bender. The monomorph resonates at a predetermined frequency when excited with electrical energy and exhibits a frequency response similar to the classical L-C tuned circuit about a predetermined center resonant frquency. An essentially single tone acoustic signal is generated by such monomorph with a frequency response dropping off rapidly on either side of the resonant frequency of the monomorph.

In one prior art approach to altering the frequency response of a piezoelectric transducer, such transducer was mounted in an enclosure which formed a resonant chamber including an aperture (port). The dimensions of the enclosure and the port were selected such that the enclosure resonated at the resonant frequency of the piezoelectric transducer and thus the acoustic signal generated at the resonant frequency of the piezoelectric transducer was reinforced or boosted. Although the amplitude of the signal generated at the resonant frequency of the transducer is increased by this approach, unfortunately, the frequency response remains a single tone or peak.

In some applications, it is desirable to have a piezoelectric electroacoustic transducer apparatus which exhibits a broader frequency response than the substantially single tone frequency response discussed above.

One object of the present invention is to provide a piezoelectric transducer apparatus exhibiting an enhanced or broadened frequency response.

Another object of the present invention is to provide a piezoelectric transducer apparatus which exhibits water resistant properties and is substantially unaffected by humidity.

These and other objects of the invention will become apparent to those skilled in the art upon consideration of the following description of the invention.

BRIEF SUMMARY OF THE INVENTION

The present invention is directed to providing an electroacoustic device which exhibits an enhanced or broadened frequency response.

In accordance with one embodiment of the invention, an electroacoustic device includes a piezoelectric driver for converting electrical energy into acoustic energy. The driver exhibits a predetermined resonant frequency and includes two opposed major surfaces. A first resonant structure is acoustically coupled to one of the major surfaces and includes at least one aperture. The first resonant structure is dimensioned to resonate at a frequency less than the resonant frequency of the driver. A second resonant structure is acoustically coupled to the remaining major surface of the driver and includes at least one aperture. The second resonant structure is dimensioned to resonate at a frequency greater than the resonant frequency of the driver.

The features of the present invention believed to be novel are set forth with particularly in the appended claims. The invention itself, however, both as to organization and method of operation, together with further objects and advantages thereof, may best be understood by reference to the following description taken in conjunction with the accompanying drawings.

DETAILED DESCRIPTION OF THE PREFERRED EMBODIMENT

Figure 1:
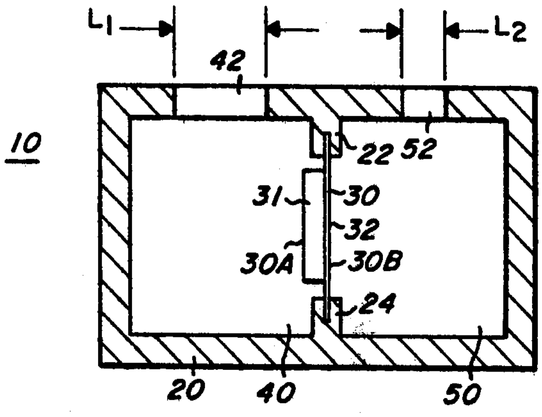
FIG. 1 is a cross-section of one embodiment of the electroacoustic device of the present invention.

FIG. 1 illustrates one embodiment of the electroacoustic device of the present invention as loudspeaker 10. Loudspeaker 10 includes an enclosure 20 exhibiting a rectangular geometry in this embodiment although it is understood that other geometries may be employed consistently with the subsequent description of the invention. Rigid materials such as plastic, polyvinylchloride, metals, nonmetals and the like may be employed to fabricate enclosure 20. As seen in FIG. 1, enclosure 20 is an essentially hollow structure.

As shown in FIG. 1, enclosure 20 includes protrusions 22 and 24 extending toward each other from opposite sides of enclosure 20. A piezoelectric driver 30, for example a monomorph including a ceramic disc 31 bonded to a metallic backplate 32, is appropriately mounted between protrusions 22 and 24 which form the support for driver 30. Driver 30 includes two major opposed surfaces 30A and 30B. It is understood that electrically conductive leads (not shown) are attached to driver 30 to provide electrical energy thereto so as to excite driver 30 into mechanical vibration. Thus mounted, driver 30 divides enclosure 20 into two cavities (chambers) 40 and 50, respectively. When electrically excited, driver 30 is induced into mechanical vibration and generates acoustic signals having the majority of their frequency components at the resonant frequency $F_1$ of driver 30. In one embodiment of the invention discussed in more detail subsequently, the resonant frequency $F_1$ of driver 30 (here a monomorph) is equal to approximately 940 Hz, for example. By examining FIG. 1, it is seen that the acoustic signals generated at major surface 30A of driver 30 are acoustically coupled into cavity 40 and the acoustic signals generated at driver surface 30B are acoustically coupled into cavity 50.

The portion of enclosure 20 adjacent chamber 40 includes a port (or aperture) 42. The dimensions of cavity 40 and port 42 are selected such that cavity 40 exhibits a resonant frequency $F_2$ less than the resonant frequency $F_1$ of driver 30. More specifically, it has been found that providing cavity 40 with a volume of 27,661 $mm^3$, a port length $L_1$ (see FIG. 1) of 1.5 mm and a port area of 42.3 $mm^2$ for port 42 results in cavity 40 exhibiting a resonant frequency $F_2$ approximately equal to 728 Hz. Cavity 40 and port 42 cooperate to form a resonant structure or Helmholtz resonator which radiates acoustic energy out port 42 with substantial frequency components at frequency $F_2$. (It is noted that the drawings are not to scale).

The portion of enclosure 20 adjacent to cavity 50 includes a port (or aperture) 52. The dimensions of cavity 50 and port 52 are selected such that cavity 50 exhibits a resonant frequency $F_3$ greater than the resonant frequency $F_1$ of driver 30. More specifically, it has been found that providing cavity 50 with a volume of 5,032 $mm^3$, a port length $L_2$ (see FIG. 1) of 1.5 mm and a port area of 31.1 $mm^2$ for port 52 results in cavity 50 exhibiting a resonant frequency $F_3$ approximately equal to 1,560 Hz. Cavity 50 and port 52 cooperate to form a resonant structure or Helmholtz resonator which radiates acoustic energy out port 52 with substantial frequency components at frequency $F_3$.

Figure 2:
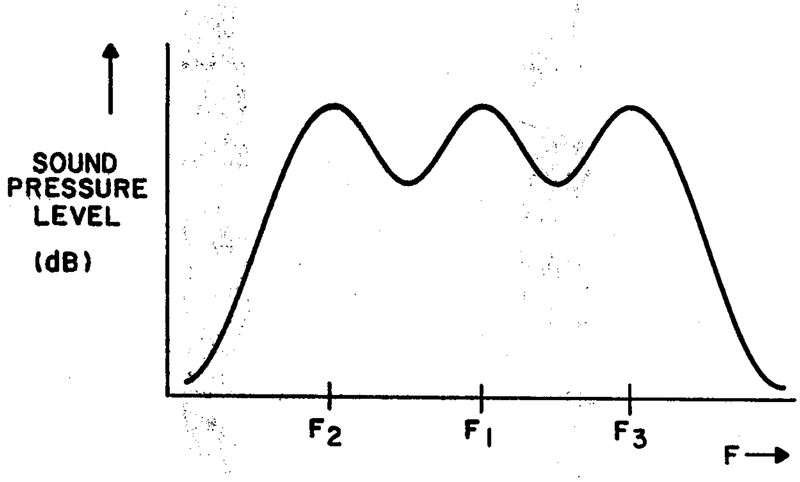
FIG. 2 is a frequency response graph of the electroacoustic device of FIG. 1.

As seen in FIG. 2, which is a graph of frequency versus sound pressure level (dB) of apparatus 10, a device exhibiting a broadened frequency response compared to the resonant frequency of driver 30 alone ($F_1$) is achieved. More specifically, acoustic signals exhibiting a frequency of approximately $F_1$ are generated by driver 30 and travel through cavities 40 and 50 and out of enclosure 20 via ports 42 and 52, respectively. These acoustic signals result in the peak in the frequency response curve of FIG. 2 seen at frequency $F_1$. The acoustic signals generated at driver surface 30A excite cavity 40 into resonance at a frequency of approximately $F_2$ and such acoustic signals exit enclosure 20 at port 42 resulting in a peak in the frequency response curve of FIG. 2 at $F_2$. The acoustic signals generated at driver surface 30B excite cavity 50 into resonance at a frequency of approximately $F_3$ and such signals exit enclosure 20 via port 52 resulting in a peak in the frequency response curve of FIG. 2 at $F_3$. Thus, as seen in FIG. 2, the electroacoustic apparatus 10 achieves a three-pole type frequency response.

Those skilled in the art will appreciate that the resonant frequencies $F_2$ and $F_3$, respectively of cavities 40 and 50, may be made closer to or further from driver resonant frequency $F_1$ by appropriately selecting the dimensions of cavities 40 and 50, namely, cavity volume, port length and port area. Further, the electroacoustic device of the present invention is not limited to the piezoelectric monomorph employed as driver 30 in the example above. Other drivers such as bimorphs and multimorphs may also be employed as driver 30.

The foregoing describes an electroacoustic apparatus exhibiting an enhanced or broadened frequency response. The electroacoustic apparatus of the present invention is desirably water resistant and operable under conditions of relatively high humidity.

While only certain preferred features of the invention have been shown by way of illustration, many modifications and changes will occur to those skilled in the art. It is, therefore, to be understood that the present claims are intended to cover all such modifications and changes as fall within the true spirit of the invention.

I claim:

1. An electroacoustic device comprising:

piezoelectric driver means, having opposed major surfaces, for converting electrical signals applied thereto into acoustic energy radiating from each of said major surfaces, said driver means exhibiting a first predetermined resonant frequency;

first Helmholtz resonator means, acoustically coupled to one major surface of said driver means, and exhibiting appropriate dimensions for resonating at a second resonant frequency less than said first resonant frequency, and second Helmholtz resonator means, acoustically coupled to the remaining major surface of said driver means, and exhibiting appropriate dimensions for resonating at a third resonant frequency greater than said first resonant frequency.

2. The electroacoustic device of claim 1 wherein said piezoelectric device means comprises a monomorph.

3. The electroacoustic device of claim 1 wherein said piezoelectric driver means comprises a bimorph.

4. The electroacoustic device of claim 1 wherein said piezoelectric driver means comprises a multimorph.

* * * * *